United States Patent
Kuo et al.

(10) Patent No.: US 12,032,020 B2
(45) Date of Patent: Jul. 9, 2024

(54) CALIBRATION DATA GENERATION CIRCUIT AND ASSOCIATED METHOD

(71) Applicant: REALTEK SEMICONDUCTOR CORPORATION, Hsinchu (TW)

(72) Inventors: Chun-Yi Kuo, Hsinchu (TW); Ying-Yen Chen, Hsinchu (TW); Hsiao Tzu Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/069,479

(22) Filed: Dec. 21, 2022

(65) Prior Publication Data

US 2023/0236246 A1    Jul. 27, 2023

(30) Foreign Application Priority Data

Jan. 21, 2022  (TW) ................... 111102610

(51) Int. Cl.
*G01R 31/28* (2006.01)
*G01R 31/3185* (2006.01)

(52) U.S. Cl.
CPC ............ *G01R 31/318552* (2013.01); *G01R 31/318541* (2013.01)

(58) Field of Classification Search
CPC ...... G01R 31/31858; G01R 31/318552; G01R 31/318541; G01R 31/318536
See application file for complete search history.

(56) References Cited

U.S. PATENT DOCUMENTS

| | | | | |
|---|---|---|---|---|
| 7,131,044 | B2* | 10/2006 | Whetsel | G01R 31/318536 714/726 |
| 7,843,218 | B1* | 11/2010 | Ramaraju | G01R 31/318541 326/46 |
| 7,958,418 | B2* | 6/2011 | Pacha | G01R 31/31858 714/729 |
| 8,332,698 | B2* | 12/2012 | Tang | G01R 31/318552 714/726 |
| 8,627,160 | B2* | 1/2014 | Devta-Prasanna | H03K 3/015 714/724 |
| 9,086,457 | B2* | 7/2015 | Maliuk | G01R 31/3177 |
| 9,182,445 | B2* | 11/2015 | Wong | G01R 31/318547 |
| 9,244,124 | B2* | 1/2016 | Alvarez-Icaza Rivera | G01R 31/318516 |
| 9,529,044 | B1* | 12/2016 | Taneja | G01R 31/318547 |
| 10,060,971 | B2* | 8/2018 | Douskey | G01R 31/318541 |
| 10,120,026 | B2* | 11/2018 | Kukreja | G01R 31/3187 |

(Continued)

*Primary Examiner* — Esaw T Abraham
(74) *Attorney, Agent, or Firm* — WPAT, P.C.; Anthony King

(57) ABSTRACT

The present application discloses a calibration data generation circuit and an associated method. The calibration data generation circuit includes: a first delay unit, having a first delay amount; and a first scan path, including: a first scan flip-flop, including: a scan data input terminal; a clock input terminal, arranged for receiving a clock signal; and an output terminal; and a second scan flip-flop, including: a scan data input terminal, coupled to the output terminal of the first scan flip-flop; a clock input terminal, arranged for receiving a delayed clock signal formed by the clock signal passing through the first delay unit; and an output terminal; wherein when the calibration data generation circuit operates, the first scan flip-flop and the second scan flip-flop are configured in a scan shift mode.

19 Claims, 4 Drawing Sheets

(56) References Cited

U.S. PATENT DOCUMENTS

2013/0111285 A1\* 5/2013 Chakravarty .. G01R 31/318541
  714/E11.155
2016/0301395 A1\* 10/2016 Suzuki ............... H03K 3/35625

\* cited by examiner

CALIBRATION DATA GENERATION CIRCUIT AND ASSOCIATED METHOD

CROSS-REFERENCE TO RELATED APPLICATIONS

This application claims priority of Taiwan application No. 111102610 filed on Jan. 21, 2022, which is incorporated by reference in its entirety.

TECHNICAL FIELD

The present application relates to a calibration method, particularly to a calibration data generation circuit and an associated method.

BACKGROUND

When designing digital circuits, electronic design automation tools are used to simulate the operation of a chip in the real world. In order to be close to the reality, certain parameters provided by the wafer foundry or summarized by the designer are usually incorporated into the simulation to simulate the on-chip variation (OCV) characteristics. However, if the OCV is too conservative, the cost of the chip may increase; if it is too relaxed, the chip may not work. Therefore, how to address these problems has become one of the most important issues in this field.

SUMMARY OF THE INVENTION

The scan chain design method and the circuit test method of the present disclosure rank all test points in the target circuit, obtain a corresponding test coverage curve according to the ranked priority, and then determine the optimal number of test points from the test coverage curve to set up the scan chain. The optimal number of test points obtained by the invention allows for sufficient test coverage, reasonable circuit area and test time when using the scan chain.

The present application provides a calibration data generation circuit, including: a first delay unit, having first delay amount; and a first scan path, including: a first scan flip-flop, including: a scan data input terminal; a clock input terminal, configured to receive a clock signal; and an output terminal; and a second scan flip-flop, including: a scan data input terminal, coupled to the output terminal of the first scan flip-flop; a clock input terminal, configured to receive a first delayed clock signal formed by the clock signal passing through the first delay unit; and an output terminal; wherein when the calibration data generation circuit operates, the first scan flip-flop and the second scan flip-flop are configured in a scan shift mode.

The present application provides a calibration method, including: performing a scan shift operation on a first scan path to obtain a first scan shift result, wherein the first scan path includes a first scan flip-flop and a second scan flip-flop that are both configured in a scan shift mode, wherein a scan data input terminal of the second scan flip-flop is coupled to an output terminal of the first scan flip-flop, the clock input terminal of the first scan flip-flop receives a clock signal, the clock input terminal of the second scan flip-flop receives a first delayed clock signal formed by passing through a first delay unit; comparing the first scan shift result with a hold time slack of the first scan path to obtain a first comparison result, wherein the hold time slack of the first scan path is generated by simulation according to a default timing derate factor; and calibrating the default timing derate factor based on the first comparison result.

The present application is able to calibrate parameters provided by the wafer foundry or summarized by the designer, so as to obtain a more precise simulation result.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

When designing a digital circuit, simulation software (e.g., electronic design automation tools) is used to simulate the operation of a chip in the real world, for example, to check whether setup time violations and hold time violations occur. This is because in the real world, even in the same clock tree, there is still a slight difference in the timing of the clock signal reaching each flip-flop, i.e., the clock skew. Further, the delay time of the data path differs between the simulated environment and the real world. Since the clock skew and data path delay may not be the same for each chip, it is necessary to import the default timing derate provided by the wafer foundry or summarized by the designer to simulate the extreme cases.

Since the default timing derate is not always accurate, especially for mature processes, the wafer fab's default timing derate for newer processes is usually more conservative. The purpose of this application is to compare the results of the calibration data generation circuit in a simulated environment with the results obtained in the real world for hold time violations, and to correct the timing derate factors accordingly.

Figure 1:
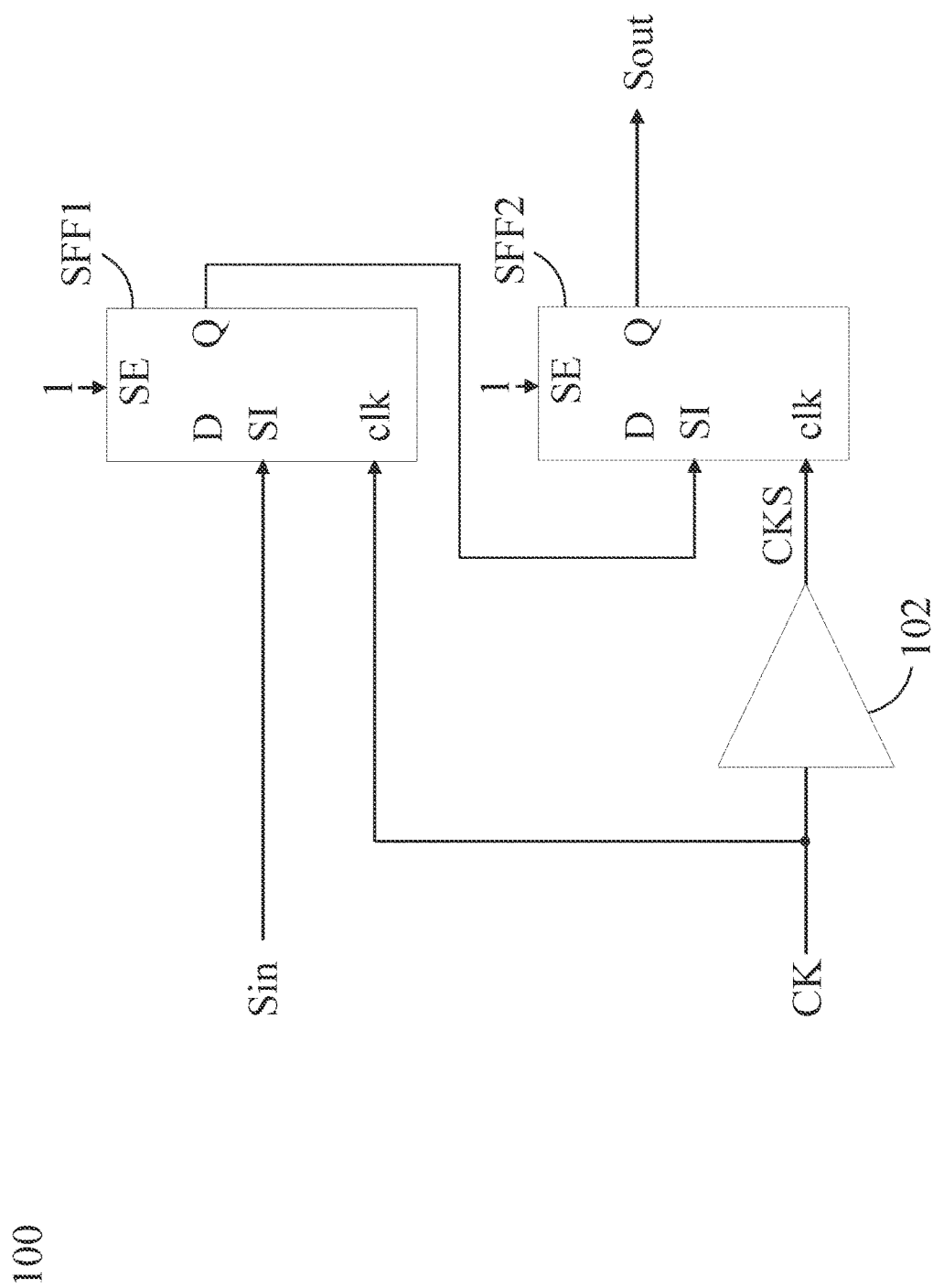
FIG. 1 is a schematic diagram illustrating a calibration data generation circuit according to one embodiment of the present disclosure.

FIG. 1 is a schematic diagram illustrating a calibration data generation circuit according to one embodiment of the present disclosure. The calibration data generation circuit 100 includes a delay unit 102 and a scan path consisting of a scan flip-flop SFF1 and a scan flip-flop SFF2. In this case, the delay unit 102 is able to make the signal passing therethrough to generate a delay having a delay amount DA, and the delay unit 102 can (but is not limited to) be implemented by, for example, a clock buffer. Each of the scan flip-flop SFF1 and the scan flip-flop SFF2 includes a data input terminal D, a scan data input terminal SI, a clock input terminal clk, an output terminal Q and a scan enabling terminal SE. The scan data input terminal SI of the scan flip-flop SFF2 is coupled to the output terminal Q of the scan flip-flop SFF1, and there are no other functional combination circuits between the scan data input terminal SI of the scan flip-flop SFF2 and the output terminal Q of the scan flip-flop SFF1.

The clock input terminal clk of the scan flip-flop SFF1 receives a clock signal CK. The clock signal CK becomes a delayed clock signal CKS after passing through the delay unit 102, which is configured to simulate a clock shift between the clock signal CK and the delayed clock signal CKS. The clock input terminal clk of the scan flip-flop SFF2 receives a delayed clock signal CKS.

When designing a chip, a designer can arrange the calibration data generation circuit 100 in the chip; such as, putting it in any non-used space of the chip (i.e., separating it from other circuit function). In this scenario, the data input terminals D of the scan flip-flop SFF1 and the scan flip-flop SFF2 are not coupled to other general function circuit, and hence, are coupled to a fixed voltage or floated. In certain embodiments, the calibration data generation circuit 100 can also be arranged with other general function circuits; that is, using the scan path of other general function circuits as the scan path of the calibration data generation circuit 100.

A designer can perform a static timing analysis (STA) on the calibration data generation circuit 100 to estimate the hold time slack using simulation software and a pre-defined timing derate factor provided by the wafer foundry or summarized by the designer before fabrication of the wafer. It should be noted that the above simulation is performed in the condition when the scan enabling terminals SE of the scan flip-flop SFF1 and scan flip-flop SFF2 are set in the scan shift mode; for example, by coupling the scan enabling terminals SE to logic 1. Also, in the scan shift mode, the input signal Sin is used to write the default parameters into the scan flip-flop SFF1 and scan flip-flop SFF2, and to confirm whether the output of the output signal Sout is correct. As mentioned above, the calibration environment is relatively simple because there are no other functional combination circuits between the scan data input terminal SI of the scan flip-flop SFF2 and the output terminal Q of the scan flip-flop SFF1.

After the chip is fabricated, a scan shift operation is performed on the test equipment for the scan path consisting of the scan flip-flop SFF1 and scan flip-flop SFF2 to obtain the scan shift result, i.e., pass or fail. If the hold time slack of the calibration data generation circuit 100 obtained from the simulation is positive (which means the simulation result is a pass), but the real world scan shift result on the test equipment is a fail, it means that the default timing derate factor is too optimistic and should be adjusted accordingly.

Figure 2:
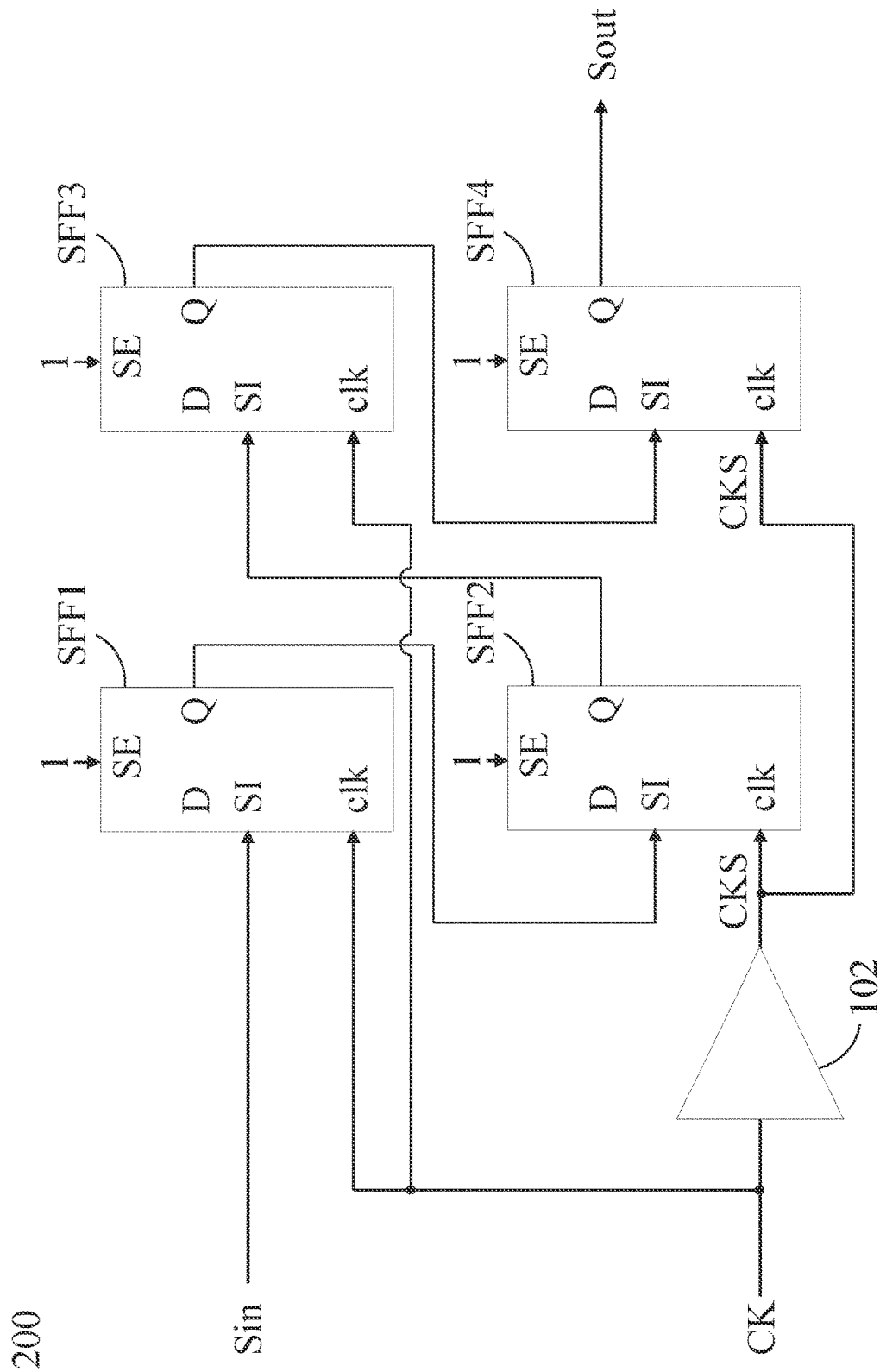
FIG. 2 is a schematic diagram illustrating calibration data generation circuit according to another embodiment of the present disclosure.

The scan flip-flop SFF1 and the scan flip-flop SFF2 can be the same type or different types. In certain embodiments, the number of the scan flip-flop included in a scan path may be more than 2. As shown in FIG. 2, the scan path of the calibration data generation circuit 200 further includes a scan flip-flop SFF3 and a scan flip-flop SFF4, in addition to the scan flip-flop SFF1 and the scan flip-flop SFF2. Each of the scan flip-flop SFF3 and the scan flip-flop SFF4 includes a data input terminal D, a scan data input terminal SI, a clock input terminal clk, an output terminal Q and a scan enabling terminal SE. The scan data input terminal SI of the scan flip-flop SFF3 is coupled to the output terminal Q of the scan flip-flop SFF2, the scan data input terminal SI of the scan flip-flop SFF4 is coupled to the output terminal Q of the scan flip-flop SFF3, and there are no other functional combination circuits between the scan data input terminal SI of the scan flip-flop SFF3 and the output terminal Q of the scan flip-flop SFF2, and there are no other functional combination circuits between the scan data input terminal SI of the scan flip-flop SFF4 and the output terminal Q of the scan flip-flop SFF3. The clock input terminal clk of the scan flip-flop SFF3 receives a clock signal CK. The clock input terminal clk of the scan flip-flop SFF4 receives a delayed clock signal CKS.

Figure 3:
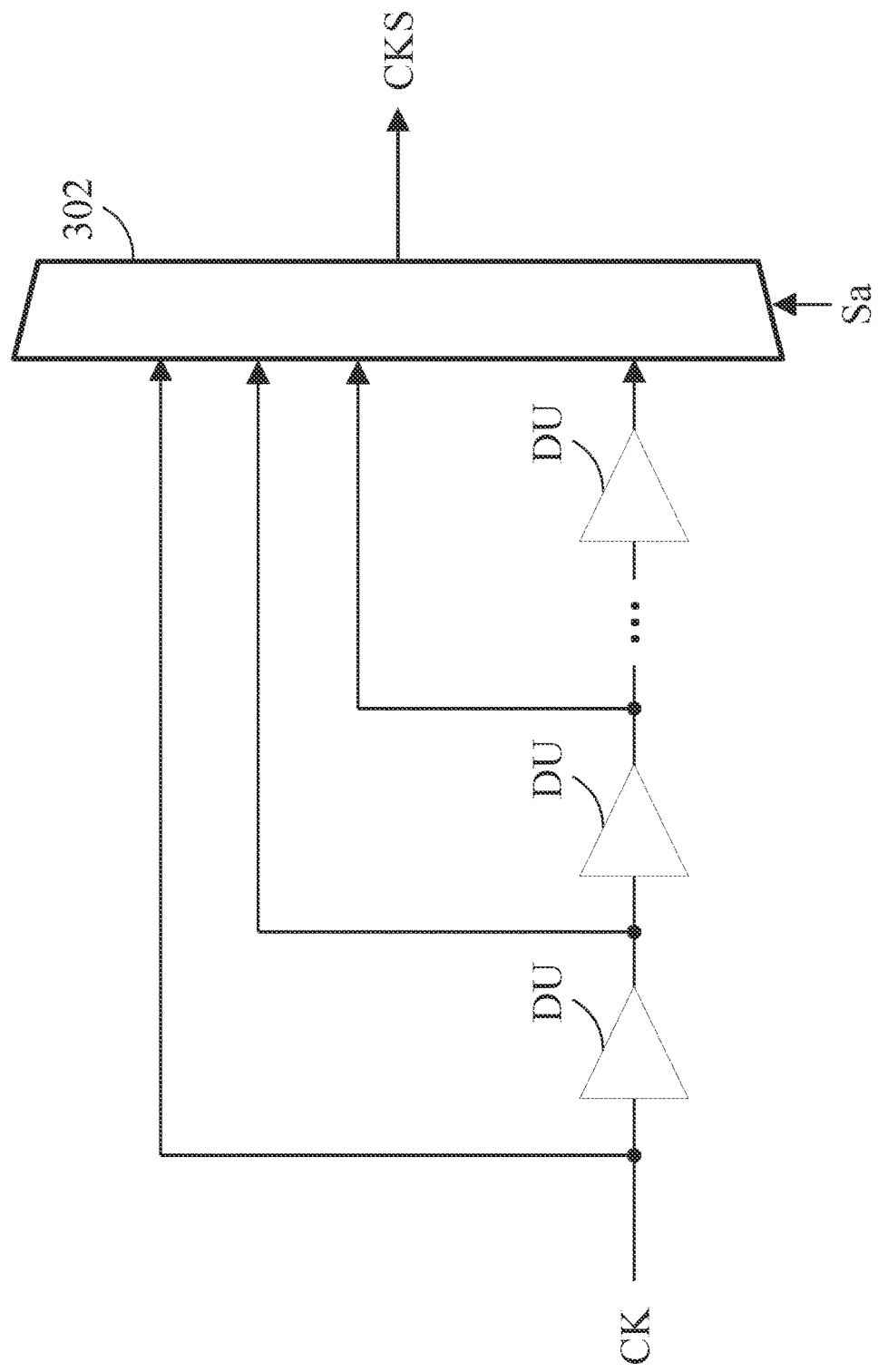
FIG. 3 is a schematic diagram illustrating a delay unit of the calibration data generation circuit according to one embodiment of the present disclosure.
Figure 4:
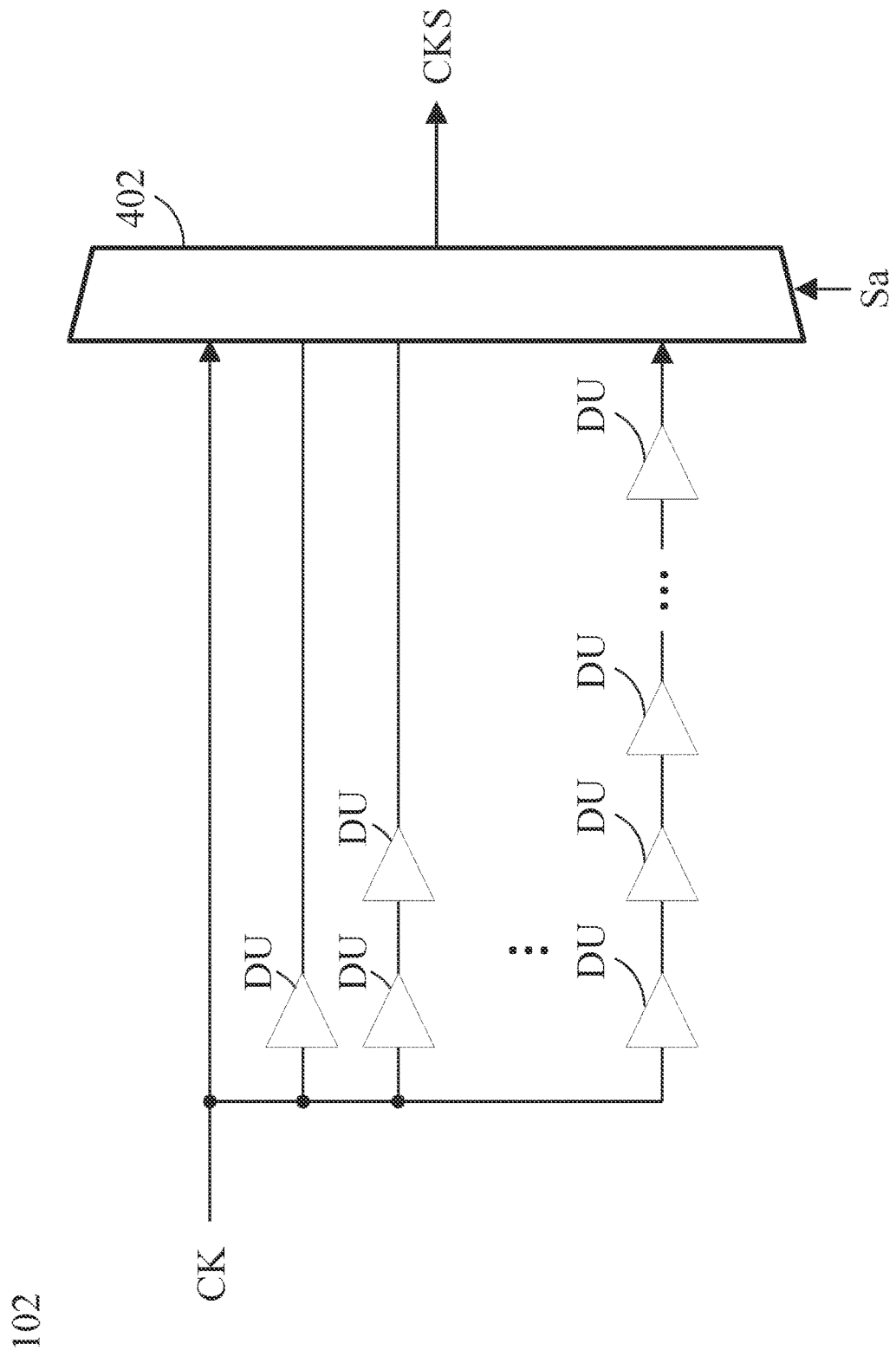
FIG. 4 is a schematic diagram illustrating a delay unit of the calibration data generation circuit according to another embodiment of the present disclosure.

In certain embodiments, the delay amount DA of the delay unit 102 is adjustable, as shown in FIG. 3 and FIG. 4. Since the numbers of the delay basic unit DU included in multiple paths are different, the delay times that a clock signal CK passing through the multiple paths are not the same. A multiplexer 302/402 is used to select one of the multiple paths according to a selection signal Sa, so as to equivalently change the delay amount DA of the delay unit 102.

TABLE 1

| Scan path No. | Clock shift | Simulated hold time slack | Scan shift result obtained by test equipment |
|---|---|---|---|
| 1 | 100 ps | 5 ps | Pass |
| 2 | 100 ps | 3 ps | Pass |
| 3 | 100 ps | 0 ps | Pass |
| 4 | 100 ps | −3 ps | Pass |
| 5 | 100 ps | −5 ps | Fail |

In certain embodiments, the scan path consisting of the scan flip-flop SFF1 and the scan flip-flop SFF2 as shown in FIG. 1 can be multiplied into a plurality of scan paths, as shown in Table 1. In this embodiment, each of scan paths 1 to 5 have a plurality of scan flip-flops connected as shown in FIG. 1, and the hold time slacks of scan paths 1 to 5 are deliberately set as 5 ps, 3 ps, 0 ps, −3 ps and −5 ps, so that an adjustment can be carried out to achieve the above-mentioned purpose when generating a layout pattern. In other words, the hold time slacks estimated for scan paths 1 to 5 using simulation software and the default timing derate factor are 5 ps, 3 ps, 0 ps, −3 ps and −5 ps. Since the clock shifts of scan paths 1 to 5 are the same, the delay unit 102 is commonly used to generate the delayed clock signal CKS.

As shown in Table 1, ideally, scan paths 1 to 3 should pass the hold time test but paths 4 and 5 would fail. However, according to Table 1, the scan path 4 can also pass the hold time test on a test equipment. Therefore, it is determined that the default timing derate factor may be too stringent to the hold time, and the corresponding calibration approach is to relax the default timing derate factor, so that the adjusted hold time slacks meet the results of the test equipment.

Since there is a certain interval between the hold time slacks of scan paths 1 to 5, to further refine the above calibration, more scan paths can be set and the interval between the hold time slacks of each scan path can be designed to be smaller. If the delay unit 102 is adjustable, it is also possible to refine the above calibration by adjusting the delay amount DA of the delay unit 102 without increasing the number of scan paths. For example, as shown in Table 2, by adjusting the delay unit 102, it is possible to equivalently adjust the clock shift between the clock signal CK and the delayed clock signal CKS for scan paths 1 to 5. Also, refer to both Table 1 and Table 2 to calibrate the default timing derate factor may in effect improves the resolution of the adjustment.

TABLE 2

| Scan path No. | Clock shift | Simulated hold time slack | Scan shift result obtained by test equipment |
|---|---|---|---|
| 1 | 101 ps | 4 ps | Pass |
| 2 | 101 ps | 2 ps | Pass |
| 3 | 101 ps | −1 ps | Pass |
| 4 | 101 ps | −4 ps | Fail |
| 5 | 101 ps | −6 ps | Fail |

In certain embodiments, two sets of scan paths each having different clock shifts can be used. As shown in Table 3, clock shifts of scan paths 1 to 5 are 100 ps; clock shifts of scan paths 6 to 10 are 120 ps. The scan paths 1 to 5 may share the delay unit 102; the scan paths 6 to 10 may share another delay unit 102. In the present embodiment, the hold time slacks of scan paths 1 to 10 are designed as 5 ps, 3 ps, 0 ps, −3 ps, −5 ps, 5 ps, 3 ps, 0 ps, −3 ps and −5 ps.

As shown in Table 3, the test result of the scan path 3 on the test equipment is a pass, but the test result of the scan path 8 on the test equipment is a fail. It can be inferred that the setting of the clock derate factor of the default timing derate factor may be too relaxed, and the corresponding calibration approach is to make the clock derate factor of the default timing derate factor more stringent, so that the adjusted hold time slacks meet the results of the test equipment.

TABLE 3

| Scan path No. | Clock shift | Simulated hold time slack | Scan shift result obtained by test equipment |
|---|---|---|---|
| 1 | 100 ps | 5 ps | Pass |
| 2 | 100 ps | 3 ps | Pass |
| 3 | 100 ps | 0 ps | Pass |
| 4 | 100 ps | −3 ps | Fail |
| 5 | 100 ps | −5 ps | Fail |
| 6 | 120 ps | 5 ps | Pass |
| 7 | 120 ps | 3 ps | Pass |
| 8 | 120 ps | 0 ps | Fail |
| 9 | 120 ps | −3 ps | Fail |
| 10 | 120 ps | −5 ps | Fail |

As can be seen from the above embodiments, the present application can compare the results obtained by the calibration data generation circuit in the simulated environment with the results obtained in the real world with respect to hold time violations, and calibrate the timing derate factors accordingly to make the simulation results more accurate.

What is claimed is:

1. A calibration data generation circuit, comprising:
   a first delay unit, having first delay amount;
   a first scan path, comprising:
      a first scan flip-flop, comprising:
         a scan data input terminal;
         a clock input terminal, configured to receive a clock signal; and
         an output terminal; and
      a second scan flip-flop, comprising:
         a scan data input terminal, coupled to the output terminal of the first scan flip-flop;
         a clock input terminal, configured to receive a first delayed clock signal formed by the clock signal passing through the first delay unit; and
         an output terminal; and
   a second scan path, comprising:
      a third scan flip-flop, comprising:
         a scan data input terminal;
         a clock input terminal, configured to receive the clock signal; and
         an output terminal; and
      a fourth scan flip-flop, comprising:
         a scan data input terminal, coupled to the output terminal of the third scan flip-flop;
         a clock input terminal, configured to receive the first delayed clock signal; and
         an output terminal;
      wherein when the calibration data generation circuit is configured to perform a first scan shift operation on the first scan path and a second scan shift operation on the second scan path, the first scan flip-flop and the second scan flip-flop are configured in a scan shift mode to obtain a first scan shift result for calibrating a default timing derate factor, and the third scan flip-flop and the fourth scan flip-flop are configured in the scan shift mode to obtain a second scan shift result for calibrating the default timing derate factor.

2. The circuit of claim 1, wherein a hold time slack of the first scan path obtained by simulation software is different from a hold time slack of the second scan path obtained by simulation software.

3. The circuit of claim 2, wherein the hold time slack of the first scan path is greater than 0, and the hold time slack of the second scan path is less than 0.

4. The circuit of claim 1, wherein the first delay unit is adjustable.

5. A calibration data generation circuit, comprising:
   a first delay unit, having first delay amount;
   a first scan path, comprising:
      a first scan flip-flop, comprising:
         a scan data input terminal;
         a clock input terminal, configured to receive a clock signal; and
         an output terminal; and
      a second scan flip-flop, comprising:
         a scan data input terminal, coupled to the output terminal of the first scan flip-flop;
         a clock input terminal, configured to receive a first delayed clock signal formed by the clock signal passing through the first delay unit; and
         an output terminal; and
   a second delay unit, having a second delay amount different from the first delay amount; and
   a third scan path, comprising:
      a fifth scan flip-flop, comprising:
         a scan data input terminal;
         a clock input terminal, configured to receive the clock signal; and
         an output terminal; and
      a sixth scan flip-flop, comprising:
         a scan data input terminal, coupled to the output terminal of the fifth scan flip-flop;
         a clock input terminal, configured to receive a second delayed clock signal formed by the clock signal passing through the second delay unit; and an output terminal;
wherein when the calibration data generation circuit is configured to perform a first scan shift operation on the first scan path and a second scan shift operation on the third scan path, the first scan flip-flop and the second scan flip-flop are configured in a scan shift mode to obtain a first scan shift result for calibrating a default timing derate factor, and the fifth scan flip-flop and the sixth scan flip-flop are configured in the scan shift mode to obtain a second scan shift result for calibrating the default timing derate factor.

6. The circuit of claim 5, further comprising:
a fourth scan path, comprising:
a seventh scan flip-flop, comprising:
a scan data input terminal;
a clock input terminal, configured to receive the clock signal; and
an output terminal;
an eighth scan flip-flop, comprising:
a scan data input terminal, coupled to the output terminal of the seventh scan flip-flop;
a clock input terminal, configured to receive the second delayed clock signal; and
an output terminal;
wherein when the calibration data generation circuit operates, the seventh scan flip-flop and the eighth scan flip-flop are configured in the scan shift mode.

7. The circuit of claim 6, wherein a hold time slack of the third scan path obtained by simulation software is different from a hold time slack of the fourth scan path obtained by simulation software.

8. The circuit of claim 7, wherein the hold time slack of the third scan path is greater than 0, the hold time slack of the fourth scan path is less than 0.

9. The circuit of claim 5, wherein the second delay unit is adjustable.

10. A calibration method, comprising:
performing a scan shift operation on a first scan path to obtain a first scan shift result, wherein the first scan path comprises a first scan flip-flop and a second scan flip-flop that are both configured in a scan shift mode, wherein a scan data input terminal of the second scan flip-flop is coupled to an output terminal of the first scan flip-flop, the clock input terminal of the first scan flip-flop receives a clock signal, the clock input terminal of the second scan flip-flop receives a first delayed clock signal formed by passing through a first delay unit;
comparing the first scan shift result with a hold time slack of the first scan path to obtain a first comparison result, wherein the hold time slack of the first scan path is generated by simulation according to a default timing derate factor; and
calibrating the default timing derate factor based on the first comparison result.

11. The method of claim 10, further comprising:
performing a scan shift operation on a second scan path to obtain a second scan shift result, wherein the second scan path comprises a third scan flip-flop and a fourth scan flip-flop that are both configured in the scan shift mode, wherein a scan data input terminal of the fourth scan flip-flop is coupled to an output terminal of the third scan flip-flop, the clock input terminal of the third scan flip-flop receives a clock signal, and the clock input terminal of the fourth scan flip-flop receives the first delayed clock signal;
comparing the second scan shift result with a hold time slack of the second scan path to obtain a second comparison result, wherein the hold time slack of the second scan path is generated by simulation according to the default timing derate factor; and
calibrating the default timing derate factor based on the second comparison result.

12. The method of claim 11, wherein a hold time slack of the first scan path is different from a hold time slack of the second scan path.

13. The method of claim 12, wherein the hold time slack of the first scan path is greater than 0, and the hold time slack of the second scan path is less than 0.

14. The method of claim 10, wherein the first delay unit is adjustable.

15. The method of claim 10, further comprising:
performing a scan shift operation on a third scan path to obtain a third scan shift result, wherein the third scan path comprises a fifth scan flip-flop and a sixth scan flip-flop that are both configured in the scan shift mode, wherein a scan data input terminal of the sixth scan flip-flop is coupled to an output terminal of the fifth scan flip-flop, the clock input terminal of the fifth scan flip-flop receives a clock signal, the clock input terminal of the sixth scan flip-flop receives a second delayed clock signal formed by passing through a second delay unit;
comparing the third scan shift result with a hold time slack of the third scan path to obtain a third comparison result, wherein the hold time slack of the third scan path is generated by simulation according to the default timing derate factor; and
calibrating the default timing derate factor based on the third comparison result.

16. The method of claim 15, further comprising:
performing a scan shift operation on a fourth scan path to obtain a fourth scan shift result, wherein the fourth scan path comprises a seventh scan flip-flop and a eighth scan flip-flop that are both configured in the scan shift mode, wherein a scan data input terminal of the eighth scan flip-flop is coupled to an output terminal of the seventh scan flip-flop, the clock input terminal of the seventh scan flip-flop receives a clock signal, and the clock input terminal of the eighth scan flip-flop receives the second delayed clock signal;
comparing the fourth scan shift result with a hold time slack of the fourth scan path to obtain a fourth comparison result, wherein the hold time slack of the fourth scan path is generated by simulation according to the default timing derate factor; and
calibrating the default timing derate factor based on the fourth comparison result.

17. The method of claim 16, wherein a hold time slack of the third scan path is different from a hold time slack of the fourth scan path.

18. The method of claim 17, wherein the hold time slack of the third scan path is greater than 0, and the hold time slack of the fourth scan path is less than 0.

19. The method of claim 15, wherein the second delay unit is adjustable.

* * * * *